Aug. 11, 1959

J. H. TEAF 2,898,767

TUNER

Filed Nov. 8, 1956

3 Sheets-Sheet 1

INVENTOR.
JOHN H. TEAF
BY
Busser, Smith & Harding
ATTORNEYS

Aug. 11, 1959 J. H. TEAF 2,898,767

TUNER

Filed Nov. 8, 1956

3 Sheets-Sheet 2

*INVENTOR.*

JOHN H. TEAF

*BY* Busser, Smith & Harding

ATTORNEYS

Aug. 11, 1959 J. H. TEAF 2,898,767

TUNER

Filed Nov. 8, 1956 3 Sheets-Sheet 3

INVENTOR.

JOHN H. TEAF

BY

ATTORNEYS 2,898,767
Patented Aug. 11, 1959

2,898,767

TUNER

John H. Teaf, Merchantville, N.J., assignor to Radio Condenser Company, Camden, N.J., a corporation of New Jersey Application November 8, 1956, Serial No. 621,136
9 Claims. (Cl. 74—10.33)

This invention relates to push button tuners of the type used for tuning radio receiving sets, particularly those involved in automobiles.

The present invention has as its objects the improvement of such tuners to secure higher reliability of proper operation and accuracy of tuning. Tuners of the type involved are necessarily mass produced mechanisms largely constituted by stamped sheet metal parts but nevertheless require precise characteristics of operation since only minute deviations represent differences between satisfactory tuning and unsatisfactory tuning of received signals.

In the usual form of such tuner variable inductance tuning is involved attained by the positioning of magnetic cores within coils forming variable inductances in the tuning circuits of a receiver. The entire range of movement of the cores is necessarily limited by space and operating considerations and nevertheless the range of tuning adjustment must cover the entire broadcast band in conventional automobile receivers. Since the receivers to be satisfactory must be highly selective, it is evident that to secure repeated tuning of particular stations the push button tuning means must very precisely position the cores in each operation. Play of parts must accordingly be reduced to a very small amount.

In my Patent 2,301,090, dated November 3, 1942, there is disclosed in Figures 1 and 2 a push button assembly which has been widely used in push button tuners. This slide assembly involves one slide member carrying an adjustable cam engageable with a treadle bar the angular position of which determines the tuning position of the variable reactors, which may be either variable condensers or variable inductances, the latter being primarily used at the present time. A second slide member is movable relative to the first. When the second slide member is withdrawn outwardly relative to the first, the adjustable cam is free to oscillate and under such condition the resetting of a slide assembly takes place by manual adjustment of the treadle bar followed by inward movement imparted to the push button which results, sequentially, in first bringing the cam into engagement with the treadle bar, whereby the cam is positioned, and then by relative movement of the two slide members an action of the locking lever mounted on the first member into tight clamping engagement with the cam. The two slides are then together moved outwardly by spring action upon release of the push button with the result that each time the slide assembly is again moved inwardly the locked cam will oscillate the treadle bar to the position corresponding to the setting attained.

While the assembly shown in said patent has been highly satisfactory, there are certain unusual circumstances which may give rise to misoperation.

For example, if friction restrains proper sliding movement of the first mentioned slide member, the attempt to effect resetting may involve a premature relative movement of the second slide member relative to the first with the result that locking of the cam may occur before the cam attains its final position which should be determined by the manually adjusted treadle bar with the result that the attempted resetting will be unsuccessful by reason of movement of the treadle bar by the cam. Accordingly, it is desirable to have some resistance offered to initiation of movement of the second member relative to the first to make more certain their moving together until the cam reaches its final position.

The second possible trouble is that due to excessive vibration there may be outward movement of the second mentioned slide member sufficient to release the cam with the result that tuning by an inward movement of the slide assembly will be unsuccessful. Even slight undesired displacement of the parts due to the above misoperations will be sufficient to defeat proper tuning.

Slight displacements of other parts of the mechanism will also prevent the maintenance of accurate tuned conditions and as will become apparent hereafter the present invention involves generally the attainment of more accurate and reliable operation under the most adverse conditions.

The attainment of the objects of the invention will become apparent from the following description read in conjunction with the accompanying drawings, in which.

Figure 1:
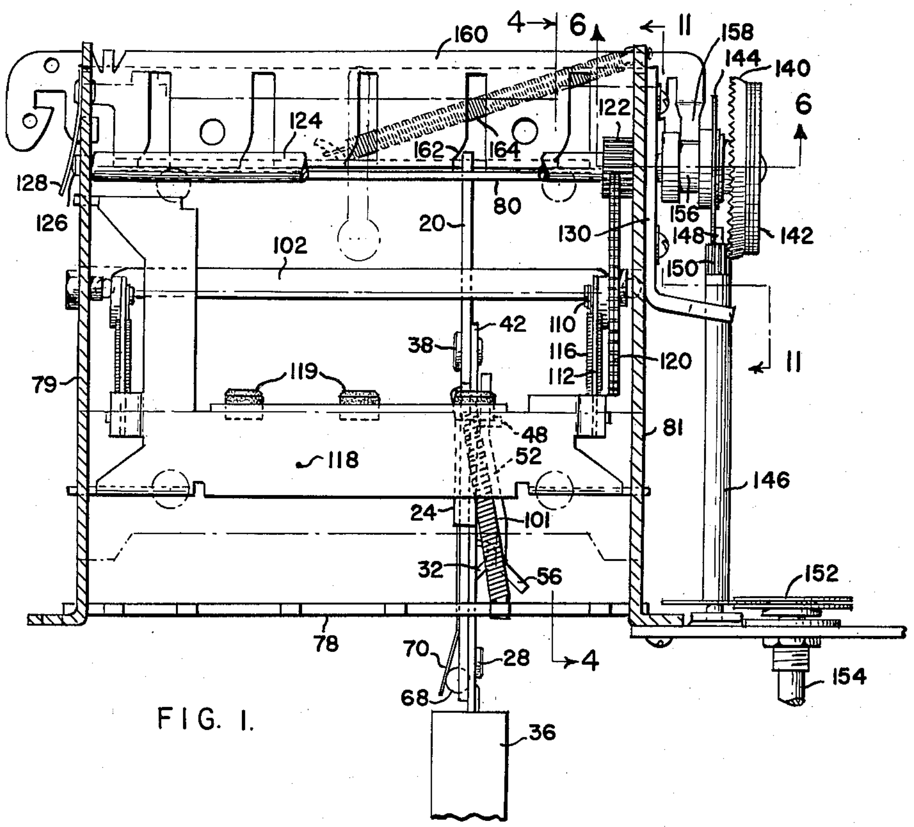
Figure 1 is a top plan view of a tuner with various parts omitted embodying the present invention.
Figure 2:
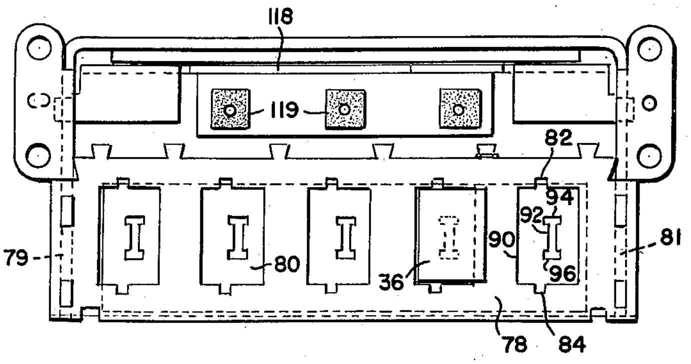
Figure 2 is a front elevation of the same also having various parts omitted.

It will be understood that most of the elements of the tuner shown herein are conventional in nature and will not be described, this being particularly true of the connections to, and mounting of, the variable inductance elements including fixed coils and movable cores. Description will first be made of the slide assembly with particular reference to Figures 7 to 10, inclusive.

The main slide member is indicated at 2 and is formed of relatively heavy stamped sheet metal and provides a pair of guide edges 4 and 6, the former terminating in a shoulder 8 at one end thereof with the provision of an ear 10 at the other end thereof which is provided with a hole 12 for the reception of a spring which normally retracts the slide member. The other guide edge 6 has at the forward end thereof a projection 14 providing on its opposite sides forwardly and rearwardly facing shoulders 16 and 18, respectively. The rear portion of the slide member 2 is extended as a tongue 20.

A second slide member which will be referred to as the actuating slide member is indicated at 22 and is also formed of stamped sheet metal with laterally turned edges 24 and 26 arranged to slide on and be guided by the guide edges 4 and 6 of the main slide member. A rivet 28 secured in the main slide member 2 projects laterally through an elongated slot 30 in the actuating slide member and is provided with a head to hold the latter in parallel sliding relationship with the former.

The actuating slide member is provided with a punched out portion forming a cam 32.

It is also provided with a serrated tang 34 on which an operating button 36 is secured in conventional fashion, not shown.

A rivet 38 passes through an opening 40 in the main slide member and is secured in a cam 42 which is provided with treadle bar engaging flats 44 and 46. As indicated in the drawing the opening 40 is not circular but is of trapezoidal shape with its sides converging toward the forward end of the slide member 2. While clearance is provided in this hole for the free rotation of the rivet 38 and the cam 42, as the cam is pressed against the treadle bar the converging edges of the opening 40 engage the rivet to effect accurate positioning thereof with respect to the slide member 2.

The slide member 2 is provided with a laterally extending T-shaped element 48 which is received in a rectangular opening 50 in a lever 52 in such fashion that the head of element 48 serves as a fulcrum for the lever. At the rear of this fulcrum the lever is provided with extruded pads 54 arranged to engage the cam 42. At its other end the lever is provided with a laterally deflected portion 56 engageable by the cam 32.

An extruded pad 58 of the slide member 2 underlies the hub portion of the cam 42 while a pair of pads 59 underlie the forward portion of the cam. These pads serve to aid in the secure clamping of this cam by the lever 52.

A spring 60 secured to the slide member 2 by rivet 28 and also by rivet 61 has a laterally turned end 62 which passes through an arcuate slot 64 in the cam 42 and engages within an extruded slot 66 in the lever 52. This portion of the spring 60 serves to release the lever from the cam when the lever is disengaged by the cam 32.

A pair of steel balls 68 are engaged by extensions 70 of the spring 60, being forced thereby toward the actuating slide member 22. These balls are received in rectangular openings 72 in the slide member 2, these rectangular openings in the longitudinal direction of the slide assembly being just slightly larger than the diameter of the balls 68 but being of somewhat greater extent in the direction transverse to the slide assembly. When the slide members are in the locking position illustrated in the figures the balls 68 seat in rectangular openings 74 which have dimensions substantially less than the dimensions of the openings 72 and the diameters of the balls, these rectangular openings 74 having their greater dimensions lengthwise of the slide assembly.

When the slide members are relatively moved to the unlocking position, the balls 68 seat in the circular openings 76 in the slide member 22 which openings have diameters less than the diameters of the balls. The arrangement thus provided affords reliable latching of the slide members relative to each other so as to prevent accidental relative displacement while, nevertheless, permitting relative movements under the application of sufficient forces. The relative transverse and longitudinal elongations of the rectangular openings 72 and 74 insure reliable latching of the two slide members in their locked relationship despite slight inaccuracies of the parts, the longitudinal range of latching being such that throughout its extent the lever 52 is so engaged by cam 32 as to insure tight clamping of cam 42.

The frame of the tuner is a conventional assembly comprising the front plate 78, the back plate 80 and plates 79 and 81 together with other structural members which need not be described in detail. The front plate 78 comprising pairs of guide channels 82 and 84 which serve for the slidable mounting of edges 86 and 88 of the slide member 2. Clearance openings 90 are provided for the slide assemblies. The back plate 80 is provided with openings 92 having upper and lower ends 94 and 95 which engage the respective upper and lower edges 98 and 100 of the tongue 20 of the slide member 2. It will be noted from Figures 7 and 9 that the edges 88 and 98 are parallel to each other and to the axis of the slide member 2 thereas edges 86 and 100 are slightly tapered to afford easy clearance when the slide members are in their forward position but to provide relatively close clearances when they are in their rearmost positions, the latter serving to insure accurate angular position about a horizontal axis so that the cams 42 have well defined positions for engagement with the paddle 102. The paddle 102 is pivoted on ball arrangements in the side plates 79 and 81 and has rounded portions 104 and 106 for engagement by the cams, clearances 108 being provided for the tongues of the slides. Each end of the paddle is provided with a pin 110 in which is pivoted one end of a link 112 the other end of which is pivoted on a pin 114 carried by a slide 118, springs 116 being provided between the pins 110 and 114 to take up lost motion. The slide 118 is guided in the side frame plates and carries the grommets 119 in which are mounted the rods of the tuning cores in conventional fashion, not illustrated, the cores being movable within coils which in conventional fashion are mounted on the frame.

Figure 11:
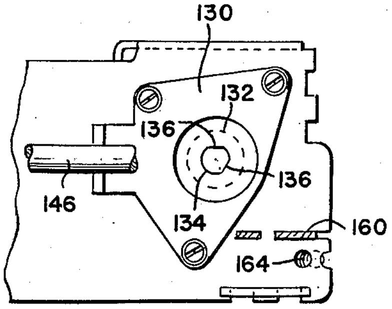
Figure 11 is a section taken on the surface the trace of which is indicated at 11—11 in Figure 1.
Figure 3:
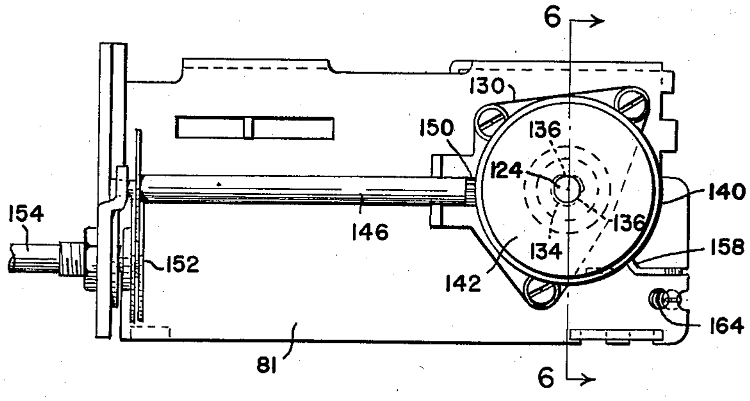
Figure 3 is a side elevation of the same with various parts omitted.
Figure 4:
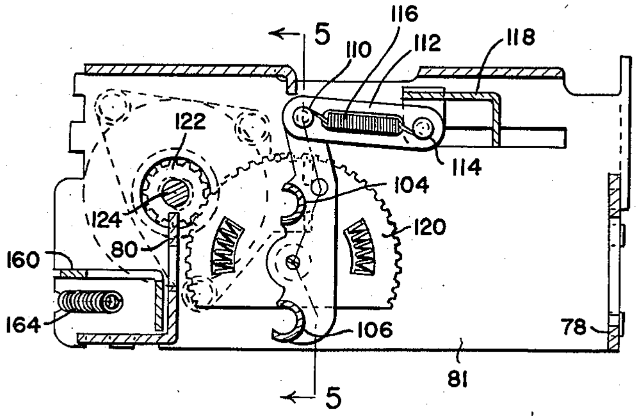
Figure 4 is a section taken on the plane indicated at 4—4 in Figure 1.
Figure 5:
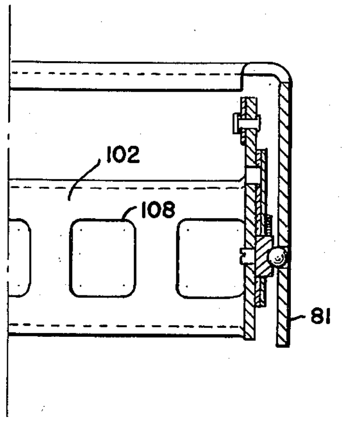
Figure 5 is a section taken on the surface indicated at 5—5 in Figure 4.
Figure 6:
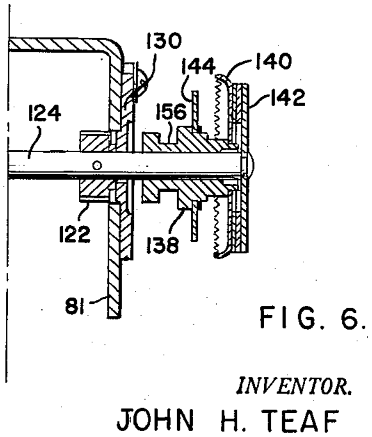
Figure 6 is a section taken on the plane indicated at 6—6 in Figure 3.
Figure 7:
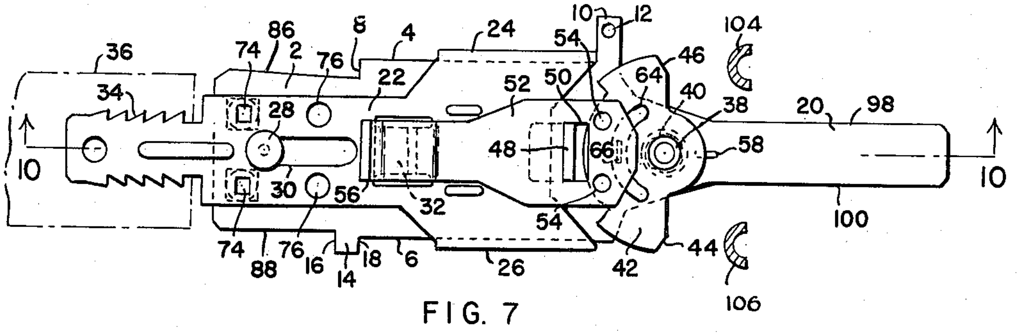
Figure 7 is a side elevation of the improved slide assembly.
Figure 8:
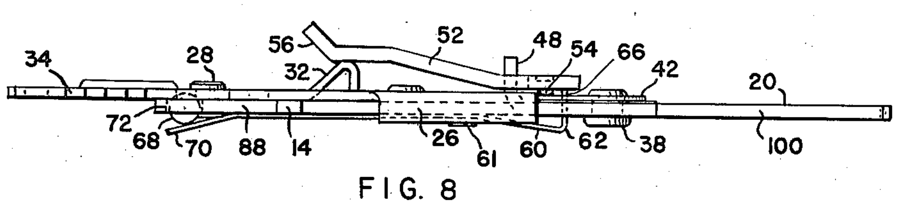
Figure 8 is a bottom plan view of the slide assembly shown in Figure 7.
Figure 9:
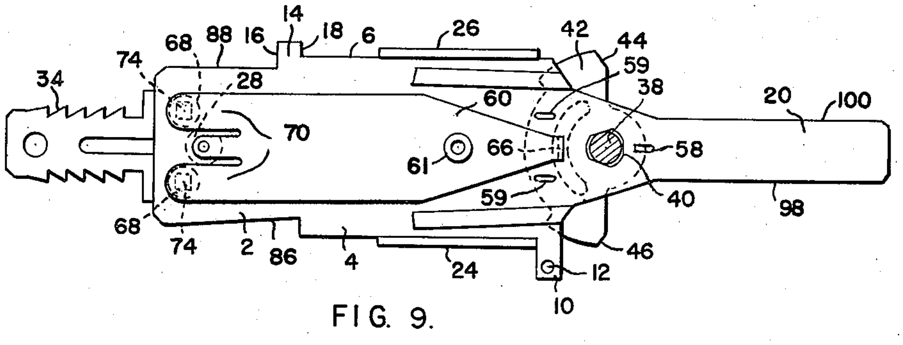
Figure 9 is a side elevation of the slide assembly shown in Figure 7 viewed from the opposite side thereof.
Figure 10:
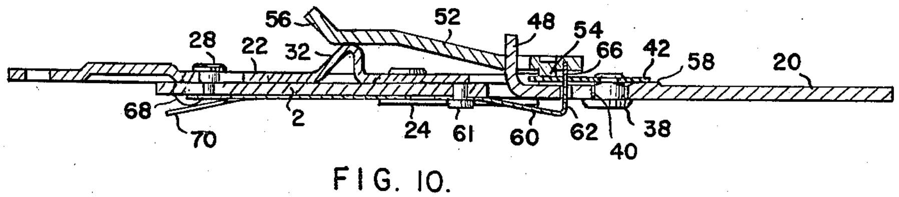
Figure 10 is a longitudinal section taken on the plane indicated at 10—10 in Figure 7.

Secured to the paddle is a gear segment 120 comprising a pair of gear members interconnected by compression springs to take up lost motion. The gear segment 120 meshes with a pinion 122 secured on a shaft 124 which at its end 126 is mounted in a hole in the side plate 79, the shaft being urged toward the right as viewed in Figure 1 by a spring 128. The right hand end of the shaft is mounted in an opening 134 in a plate 130 which is secured to the side plate 81 and is provided with a boss 132 engaging a corresponding opening in this side plate. The hole 134 in which the shaft is mounted is illustrated in Figure 11, departing from a circular form by reason of the flats 136 which are arranged to have an included angle of approximately 60°, the bisector of these flats extending upwardly toward the rear of the frame assembly in line with the planes of the axes of pinion 122 and gear 120. By reason of this arrangement, due to the pressure angles of the teeth of segment 120 and pinion 122 the efforts of the segment to impart rotation to the shaft 124 cause the right hand end of the shaft to be forced toward the convergence of the flats 136 with the result that during such action the right hand end of the shaft has a definitely set location, this being also true of the action involved when the shaft 124 is manually driven to position the segment 20 and the paddle. Thus at all times there is for a particular position of shaft 124 a corresponding particular position of the paddle so that in the procedure of setting the cams 42 there is substantially eliminated any possibility that the setting of the paddle achieved by manual adjustment will become disturbed. The result is that in the setting of a cam there is no detuning involved as a slide assembly is moved inwardly and locked. Despite the accurate setting of the position of the shaft 124 by reason of the flats 136 the bearing arrangement thus provided does not prevent the desired easy rotation of shaft 124. It may be noted that this mounting of the shaft is only required at its right hand end since the effect of a slight running clearance at its left hand bearing will have negligible effect at its right hand end.

Slidable on the right hand end of shaft 124 is a hub 138 on which is secured a crown gear 140 carrying one element of a friction clutch the other element of which is carried by a plate 142 riveted to the end of shaft 124. The hub also carries a spring plate 144 engageable with a small diameter extension 148 of a shaft 146 on which is formed the pinion 150 engaging the crown gear, the shaft 146 being driven through a friction drive arrangement 152 from a manual tuning knob secured to shaft 154.

The hub 138 is provided with an annular groove 156 within which there engages the finger 158 of a slide 160 which is transversely slidable in the frame and urged toward the right to produce clutch engagement by a spring 164. The slide 160 is provided with cam edges 162 engageable by the rear ends of the tongues 20. The arrangements last described are conventional in tuners and will provide clutch engagement except when the slides are moved rearwardly, whereupon the clutch is disengaged to provide free movement of the shaft 124 as the paddle 102 is rocked during push button tuning.

The operation from the standpoint of the user of the tuner is essentially conventional. However, the improvements provide for more accurate tuning and maintenance of tuning and insure against improper operations. When a cam 42 is to be reset, the operator will tune in the station to which resetting is desired by manual adjustment of the shaft 154 which positions the paddle 102 in correspondance with the tuning selected. The button 36 of the assembly to be reset is then pulled outwardly which results in the balls 68 engaging within the openings 76 with release of the lever 52 by the cam 32 and release of the previous clamping pressure on the cam 42. When the push button is then moved inwardly relative movement between the slide members is yieldingly prevented by the engagement of the balls in openings 76. Thus the entire assembly is moved inwardly with the cam 42 free to be positioned by the paddle with both of its edges 44 and 46 engaging the paddle. When this condition is reached movement of the slide member 2 is arrested. The application of continued pressure overcomes the resistence offered by the engagement of the balls 68 in the openings 76 and further movement imparted to the button 46 produces relative movement of the slide members with the result that the cam 32 passes beneath the lever 52 to effect clamping of the cam 42 in its new adjusted position.

The engagement between the balls 68 and holes 76 insures against relative movement of the slide members due to possible friction or load on the slide member 2 until there is exerted a substantial force on the button 35 sufficient to overcome any ordinary resistance which might be involved. Thus premature clamping of the cam 42 is prevented.

After locking occurs the engagement of the balls 68 within the openings 74 provides a latching action which will prevent ordinarily encountered vibrations from permitting relative movement of the slide member 22 forwardly with respect to the slide member 2. Thus the cam 32 is prevented from becoming accidently released from the lever 52. As will be clear from Figures 8 and 10, the cam 32 when it engages lever 52 is in a position well beyond the forward end of the lever and in engagement with an extended surface of the lever 52 which is substantially parallel to the slide members at that time. Thus even slight freedom of relative movements due to the ball and socket arrangements previously described will not affect the maintenance of the locking position of the lever 52. On the other hand, the ball and socket latching arrangement is readily disengaged by an outward pull on a button 36.

The right hand bearing mounting of the shaft 124 insures its accurate maintenance in the position to which it is adjusted and thus prevents detuning upon push button resetting as already described.

It will be obvious that various changes in details of construction may be made without departing from the invention as defined in the following claims.

What is claimed is:

1. A tuner comprising a movable member, a pivoted element connected to said movable member, and a slide assembly, said slide assembly comprising first and second slide members, a cam carried by the first of said slide members and arranged to engage said pivoted element, a lever carried by the first of said slide members and arranged to engage and clamp said cam, a second cam carried by the second of said slide members and arranged to engage said lever to clamp the first mentioned cam when said slide members are in one relationship to each other and to release said lever to release the first mentioned cam when said slide members are in another relationship to each other and ball and socket means for releasably latching said slide members in the first mentioned relationship.

2. A tuner comprising a movable member, a pivoted element conected to said movable member, and a slide assembly, said slide assembly comprising first and second slide members, a cam carried by the first of said slide members and arranged to engage said pivoted element, a lever carried by the first of said slide members and arranged to engage and clamp said cam, a second cam carried by the second of said slide members and arranged to engage said lever to clamp the first mentioned cam when said slide members are in one relationship to each other and to release said lever to release the first mentioned cam when said slide members are in another relationship to each other and ball and socket means for releasably latching said slide members in the second mentioned relationship.

3. A tuner comprising a movable member, a pivoted element connected to said movable member, and a slide assembly, said slide assembly comprising first and second slide members, a cam carried by the first of said slide members and arranged to engage said pivoted element, a lever carried by the first of said slide members and arranged to engage and clamp said cam, a second cam carried by the second of said slide members and arranged to engage said lever to clamp the first mentioned cam when said slide members are in one relationship to each other and to release said lever to release the first mentioned cam when said slide members are in another relationship to each other and ball and socket means for releasably latching said slide members in both of said relationships.

4. A tuner comprising a movable member, a pivoted element connected to said movable member, and a slide assembly, said slide assembly comprising first and second slide members, a cam carried by the first of said slide members and arranged to engage said pivoted element, a lever carried by the first of said slide members and arranged to engage and clamp said cam, a second cam carried by the second of said slide members and arranged to engage said lever to clamp the first mentioned cam when said slide members are in one relationship to each other and to release said lever to release the first mentioned cam when said slide members are in another relationship to each other, said first mentioned cam and said first slide member having a pivotal connection involving a cylindrical shaft mounted in an opening having converging edge portions whereby the shaft by engagement with the converging edge portions effects accurate positioning of said first mentioned cam with respect to said first slide member.

5. A tuner according to claim 4 in which said converging edge portions of the opening are directed so that as said first mentioned cam engages said pivoted element the shaft becomes wedged between said converging edge portions.

6. A tuner according to claim 4 in which said shaft is secured to said first mentioned cam and the opening is in said first slide with said edge portions converging in the direction in which the slide assembly moves in effecting release of the pivoted element by the first mentioned cam.

7. A tuner according to claim 5 in which said shaft is secured to said first mentioned cam and the opening is in said first slide with said edge portions converging in the direction in which the slide assembly moves in effecting release of the pivoted element by the first mentioned cam.

8. A tuner comprising a frame, a movable member, a pivoted element connected to said movable member, a plurality of slide assemblies engageable selectively with said movable member, a shaft, a pinion carried by said shaft, a gear carried by said pivoted element and meshing with said pinion, manual means for adjusting said shaft, and means for mounting said shaft in said frame, the last mentioned means providing an opening receiving said shaft, the opening having converging edge portions engaging said shaft adjacent to said pinion.

9. A tuner comprising a frame, a movable member, a pivoted element connected to said movable member, a plurality of slide assemblies engageable selectively with said movable member, a shaft, a pinion carried by said shaft, a gear carried by said pivoted element and meshing with said pinion, manual means for adjusting said shaft, and means for mounting said shaft in said frame, the last mentioned means providing an opening receiving said shaft, the opening having converging edge portions engaging said shaft adjacent to said pinion, said edge portions converging in a direction away from the meshing region of said pinion and gear so that the driving pressures between the teeth thereof force the shaft into the convergence of said edge portions.

References Cited in the file of this patent

UNITED STATES PATENTS

| | | |
|---|---|---|
| 2,301,090 | Teaf | Nov. 3, 1942 |
| 2,489,544 | Schwartz et al. | Nov. 29, 1949 |
| 2,659,236 | Allen | Nov. 17, 1953 |
| 2,793,531 | Thompson | May 28, 1957 |